United States Patent [19]

Rosen et al.

[11] Patent Number: 5,001,355

[45] Date of Patent: Mar. 19, 1991

[54] PHOTON ENERGY ACTIVATED RADIO FREQUENCY SIGNAL SWITCH

[75] Inventors: Arye Rosen, Cherry Hill, N.J.; Paul J. Stabile, Langhorne, Pa.; Robert N. Hurwitz, Cherry Hill, N.J.; Joseph R. Delmaster, Jr., Norristown, Pa.; Philip C. Basile, Turnersville, N.J.

[73] Assignee: General Electric Company, Camden, N.J.

[21] Appl. No.: 412,032

[22] Filed: Sep. 25, 1989

[51] Int. Cl.⁵ .............................................. G02B 27/00
[52] U.S. Cl. .................................... 250/551; 307/311
[58] Field of Search ...................... 250/551; 307/311; 455/617, 618, 619; 357/30 P

[56] References Cited

U.S. PATENT DOCUMENTS

| | | | |
|---|---|---|---|
| 3,304,430 | 2/1967 | Biard et al. | 250/551 |
| 4,240,088 | 12/1980 | Myers | 250/551 |
| 4,805,084 | 2/1989 | Rosen et al. | 357/30 P |
| 4,825,081 | 4/1989 | Wille et al. | 250/551 |

OTHER PUBLICATIONS

"Laser-Activated p-i-n Diode Switch for RF Application," *IEEE Transactions on Microwave Theory and Techniques*, vol. 37, No. 8, Aug. 1989, pp. 1255–1257, by Arye Rosen et al.

"Laser Activated PIN Diode Switch from DC to mm-- Wave," Session 13: New Applications for Electro-Optical Components, *Electro/89 Electronic Show and Convention*, Jacob K. Javits Convention Center, New York, N.Y. Apr. 11-13, 1989, Session 13/4 pp. 1-6, by Arye Rosen et al.

*Primary Examiner*—David C. Nelms
*Attorney, Agent, or Firm*—Raymond E. Smiley

[57] ABSTRACT

A photon energy activated PIN diode is reverse biased by a continuously supplied direct current voltage. The PIN diode is rendered conductive for passage of a radio frequency input signal when it is illuminated. Continuous illumination of the PIN diode is not required for conduction such that illumination may be pulsed on and off while the diode remains conductive.

10 Claims, 3 Drawing Sheets

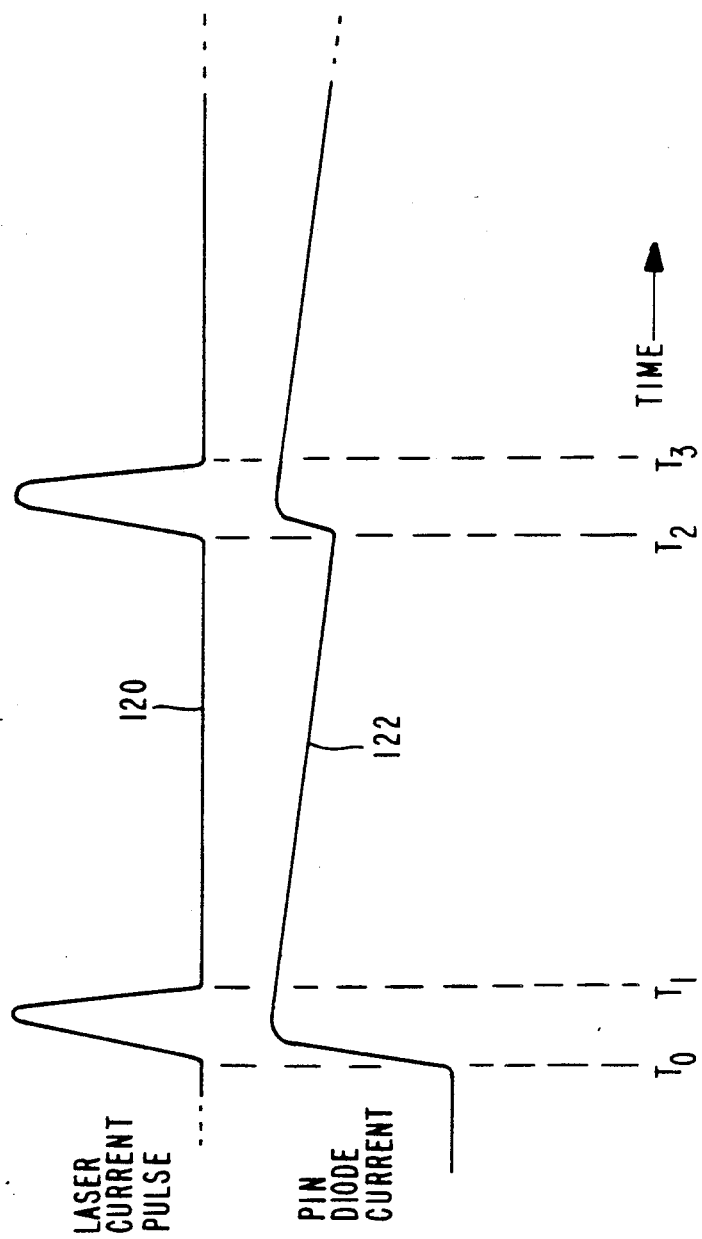

PHOTON ENERGY ACTIVATED RADIO FREQUENCY SIGNAL SWITCH

BACKGROUND OF INVENTION

1. Field of Invention

This invention relates to semiconductor electrical switches for switching radio frequency signals and, more particularly, to such switches which are activated by aplication of photon energy.

2. Description of the Prior Art.

There are applications such as frequency shifting that require the ability to rather rapidly connected and disconnect an RF signal path to pass several hundred watts of signal power. A PIN diode is an ideal candidate for this task. However, switching such PIN diodes "on" or "off" with a biasing power supply is a difficult task.

It is known to utilize PIN diodes which are optically activated (switched on and off) such as by a switched laser to modulate an input signal. However, the light levels necessary to continouosly render conductive the PIN diodes to pass the required RF power is sufficiently great such that overheating of the light source is likely and thus PIN diode switches have not been used for this purpose.

SUMMARY OF THE INVENTION

A photon energy activated radio frequency (RF) signal switch comprises in combination, a photon energy activated PIN diode coupled between a signal input terminal and a signal output terminal, means for reverse biasing the PIN diode by continuously supplying a direct current voltage thereto, a source of RF signal coupled to the input terminal and means for selectively providing photon energy to the PIN diode to render it conductive to pass said RF signal from the input terminal to the output terminal.

BRIEF DESCRIPTION OF THE DRAWINGS

FIG. 4 is a set of waveforms useful in understanding the operation of the PIN diode switch of FIG. 1.

DETAILED DESCRIPTION

Figure 1:
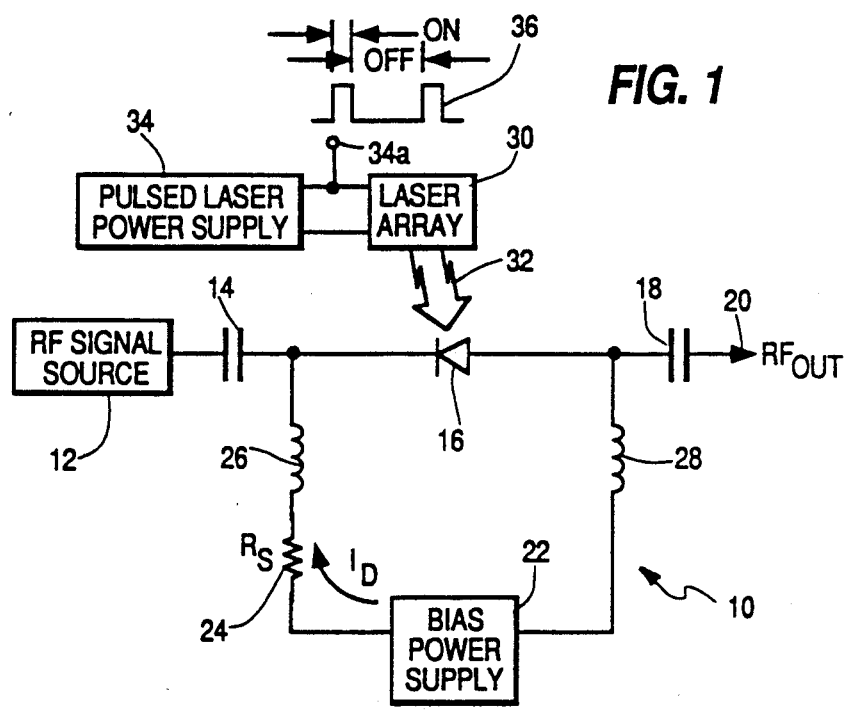
FIG. 1 is an optically activated RF switch in accordance with a preferred embodiment of the present invention.

FIG. 1, to which attention is now directed, illustrates a preferred embodiment of a photon energy activated PIN diode switch 10 for use in switching an applied radio frequency (RF) signal from RF source 12. RF signal source 12 is coupled via a direct current (DC) blocking capacitor 14 to the cathode of a photon energy activated PIN diode 16 to be described in more detail hereinafter. The diode 16 is coupled via DC blocking capacitor 18 to an RF output terminal 20.

PIN diode 16 is reverse-biased by a direct current power supply 22 series connected with a bias resistor 24 and a pair of AC blocking inductors 26, 28. An exemplary range of voltage for supply 22 is 100-1000 volts. Experimentation with various values of bias resistor 24 have shown that a comparison of PIN diode insertion loss with a 110 ohm resistor rather than a 55 ohm resistor showed a 4-to-1 improvement in insertion loss and further improvement was obtained by increasing the bias resistor to higher values. The PIN diode 16 is rendered conductive by light from a light source 30 such as a laser array to be described in detail hereinafter. A typical peak light output power is 200 watts.

The light from laser array 30, indicated as arrow 32, is directed toward PIN diode 16, and, more particularly, the intrinsic (I) region thereof. Laser 30 is powered by a laser power supply 34. In general when the laser array is turned off, PIN diode 16 is back biased and no RF signal is transmitted from source 12 to RF output 20; when the laser array is turned on, pin diode 16 is illuminated and RF signal is passed from source 12 to output 20. The power required of laser array 30 to drive PIN diode 16 into conduction is rather large, on the order of several hundred watts in a typical application as indicated above. With the resulting temperature, the laser array tends to become overheated and it is difficult, if not impossible, to dissipate the heat generated thereby during continuous periods of activity required while RF signal source 12 is transmitting a signal. The inventors have discovered that it is not necessary that laser array 30 be continuously conductive for continuous signal to flow continuously from source 12 to RF output 20. Rather, the laser array may be pulsed on and off as indicated by waveform 36 which represents the signal appearing at laser power supply output terminal 34a. FIG. 4 illustrates an exemplary laser current pulse waveform 120 and resulting pulse diode current waveform 122. The laser array on-time ($T_0$ to $T_1$ and $T_2$ to $T_3$, for example) may only be on the order of few percent or so of the total pulse-to-pulse time ($T_0$ to $T_2$, for example) between on pulses from pulses laser power supply 34. With the less than two percent duty cycle it is relatively easy to dissipate the heat generated in laser array 30. In one exemplary embodiment PIN diode 16 remained continuously conducting with a laser on time of 1 microsecond and a laser off time of 60 microseconds.

Figure 2:
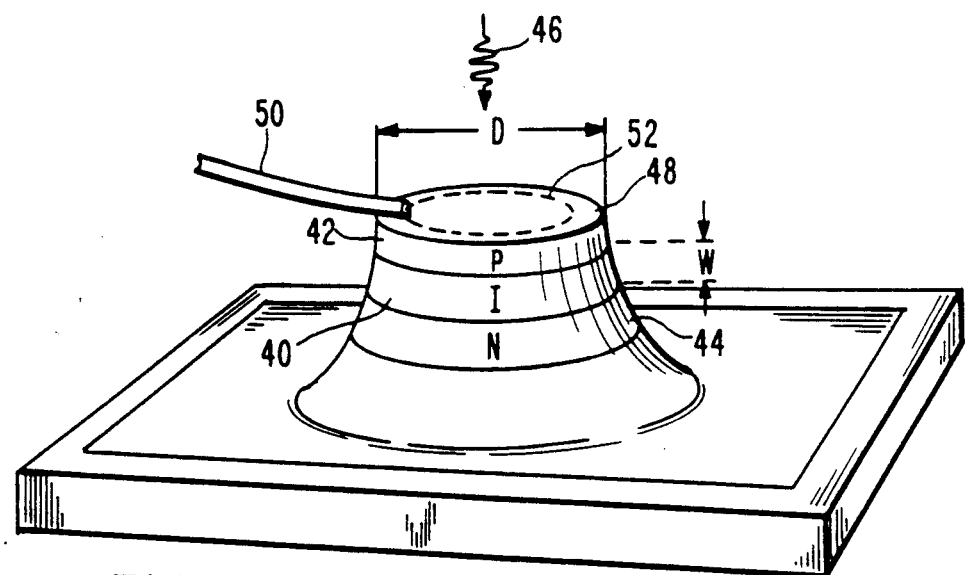
FIG. 2 illustrates one exemplary PIN diode for use in the switch of FIG. 1.

FIG. 2, to which attention is now directed, illustrates a single PIN diode 38 which may be used singly or in a series or parallel connection with other similar diodes to form PIN diode 16 shown in FIG. 1. Diode 38 includes an intrinsic (I) silicon region 40 which is lightly doped. Silicon has four valence electrons. A region 42 overlies I region 40. Region 42 is doped in known fashion with boron atoms, each with three valance electrons. The boron atoms are substituted in the lattice for some of the silicon atoms, whereby three electrons are "accepted" by the boron to form four convalent bonds around each boron atom, and a positively-charged "hole" is created in the valance bands. Doped region 42 is therefore a P region. Intrinsic region 40 overlies a region 44 which is doped, also in known fahion, with phosphorus atoms. Each phosphorus atom has five valance electrons. When substituted into the silicon lattice, each phosphorus atom donates one electron to the conduction band, creating a negative charge to form an N region. As illustrated in FIG. 2, the intrinsic region has a width W, measured between P and N regions. The diode also has a diameter D. As illustrated in FIG. 2, light represented by photon symbol 46 impinges on the upper surface of diode 38. An upper conductive layer 48 makes ohmic contact with P region 42 and is connected to a wire 50. If layer 48 is opaque, a window may be defined in the center OF layer 48 as suggested by dotted outline 52. As an alternative to a window, a continuous layer 48 may be formed from a transparent conductor such as a very thin film of metal. Exemplary metals are gold, copper, silver, and indium. Alternatively, a somewhat thicker layer of indium-tin oxide, tin oxide, or cadmium oxide may be utilized.

A theoretical basis is not well established for quantitative analysis of a reverse-biased PIN diode with "current injection" by means of photon absorption. It is expected that the quantitative analysis based upon forward-bias theory will be at least indicative of trends for the reverse-bias case.

At high frequencies the on resistance of an illuminated PIN diode is given by the expression:

$$R_F = W^2/(I_F \tau_{eff} \mu) \quad (1)$$

where:
W is the width of the intrinsic region measured between the P and N regions;
$\tau_{eff}$ is the photocurrent lifetime in the intrinsic region;
$\mu$ is the sum of the whole and electron mobilities; and
$I_F$ is the photocurrent given by the formula:

$$I_F = \frac{qp}{h\nu}\left[1 - \frac{e^{-\alpha w}}{(1 + \alpha L_p)}\right] \quad (2)$$

P = power incident on the detector
hν = photon energy
α = absorption coefficient of semiconductor
W = thickness of intrinsic region
$L_P$ = carrier diffusion length
q = electron charge $1.6 \times 10^{-19}$ coul.

Depletion layer photodiodes of which a PIN diode is one example are essentially reverse-biased semiconductor diodes whose reverse current is modulated by electron-hole pairs produced in or near the depletion layer by the absorption of light.

For a given semiconductor, the wavelength range in which appreciable photocurrent can be generated is limited. For light waves whose energy is less than the band gap energy, the intrinsic optical obsorption coefficient α is too small to give appreciable absorption. For high energy photons, α is very large and absorption takes place near the surface where the recombination time is short. The photocarriers thus recombine before they are swept out.

Figure 3:
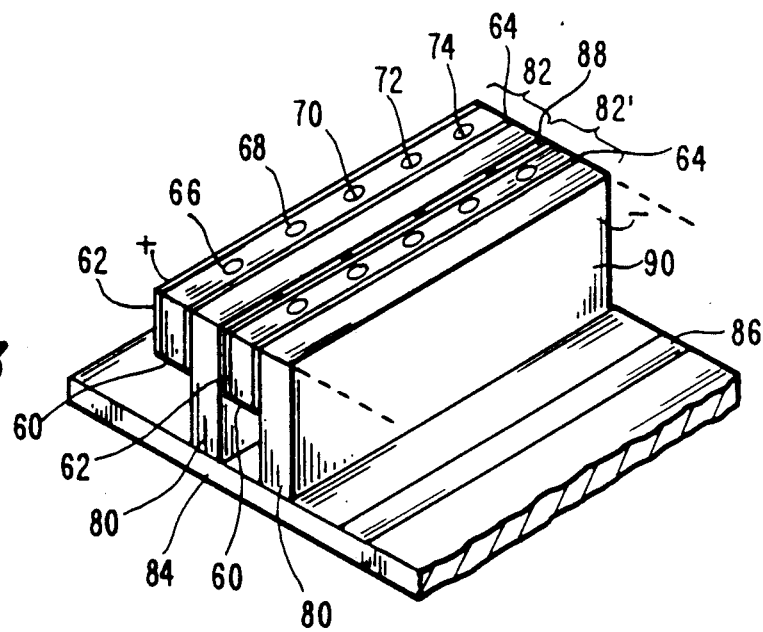
FIG. 3 illustrates one exemplary laser diode array used for illumination of the PIN diodes of FIG. 1.

FIG. 3, to which attention is now directed, illustrated a two dimensional laser diode array 30 suitable for use in illuminating PIN diode 16 of FIG. 1 with photon energy. In FIG. 3, laser diode array 30 includes a plurality of one dimensional laser array assemblages 82 (two, 82 and 82' being shown). Array assemblage 82 includes a layered semiconductor substrate 60, the individual layers of which are not illustrated. Semiconductor substrate 60 lies between metallized layers 62 and 64 which are adapted to receive direct voltage, illustrated as positive (+) on layers 62 (The negative voltage is supplied via assemblage 82'.) in order to produce photon energy in the form of light radiation from a plurality of discrete radiation sites, 66, 68, 70, 72 and 74 being exemplary. Each laser array assemblage 82 also includes a rectangular block 80 of thermally conductive material such as surface-metallized beryllium oxide (BeO) to which is bonded, for example by soldering, conductor 64. Thus, FIG. 3 illustrates a two-dimensional radiating array of laser diodes.

The blocks 80 of thermally conductive material are mounted to a thermally conductive BeO mounting substrate 84 which has deposited thereon a series of spaced metallization stripes, one of which is illustrated as 86. Metallizatin stripes 863 provide a surface to which heat sinks 80 of assemblage 82 may be attached as by soldering. When so arranged, the laser diode array of assemblage 82' has a heat sink 80 on each side, each of which conducts heat from the laser diode array to mounting substrate 84, which either rejects the heat directly or conducts it to a further heat sink, not illustrated.

In FIG. 3 assemblages 82 and 82' are spaced apart slightly to form a gap 88, and electrical contact is made by means of gold bumps, not separately designated. Such gold bumps provide a certain amount of cushioning to aid in preventing stress due to thermal effects, and also to provide some thermal contact. Alternatively, the adjacent surfaces of assemblages 82 and 82' may be soldered together directly, without gold bumps. In either manner of assembly, the linear arrays of laser diodes are energized in a series combination with electrical connection made to apply positive voltage to conductor 62 and negative voltage to conductive surface 90 of that sink 80 as indicated by +and−signs, resepctively. Additinal assemblages similar to 82 (but not illustrated) can be added to the array of FIG. 3 to provide any desired amount of light in the order of a few kilowatts/centimeter. An exemplary amount of light power provided by the array 30 of FIG. 3 in 200 watts.

Figure 5:
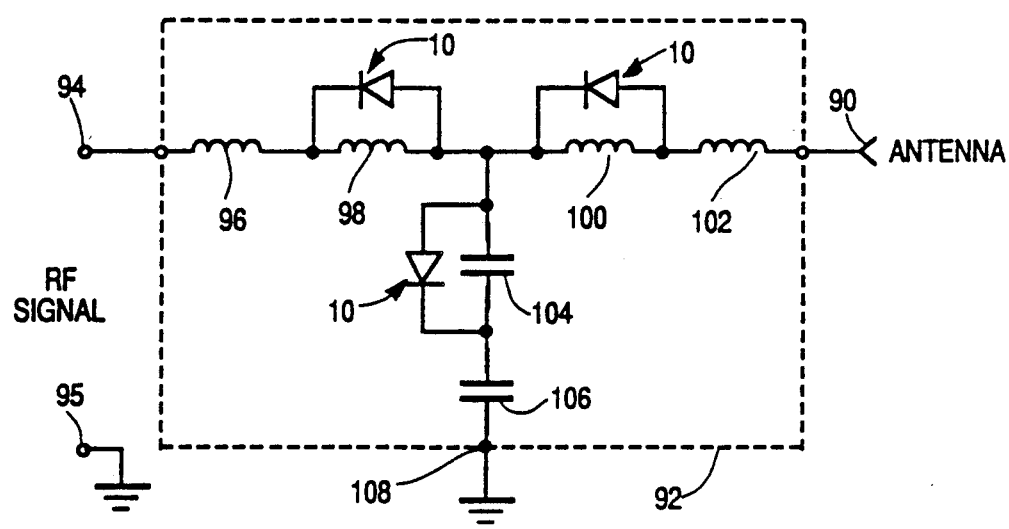
FIG. 5 is one application for the switch of FIG. 1.

FIG. 5, to which attention is now directed, shows one application for the optically activated PIN diode switch 10 of FIG. 1. In FIG. 5, and RF signal applied at terminals 94 and 95 which may rapidly transition between various frequencies in the 2–30 MHz region is intended to be applied to an antenna 90, which may be a short high-Q antenna. The RF signal is applied to a reactive matching circuit shown within dashed block 92. A severe problem is encountered in the matching of short, high-Q antennas used in high frequency radios for 2–30 MHz and at the same time providing rapid frequency tuning of the antenna matching networks for maximum power efficiecy. Therefore, the purpose of the reactive matching circuit, including the optically activated PIN diode switch 10 is to match the RF signal to the high-Q antenna while operating an agile antenna coupler. Because the characteristics of the matching circuit must match the RF signal to the antenna, the various inductive and capacitive components contained therein must be able to rapidly change value. This is accomplished by having each component (capacitor or inductor) comprised of two (or more) sections. A PIN diode switch is placed across one of the sections to either allow RF signal to pass through that section or bypass that section through the RF switch. Thus, for example, the RF signal is applied at terminal 94 to a T-type matching network comprising first, second, third, and fourth series connected inductors 96, 98, 100, and 102. The juncture of inductors 98 and 100 is connected via capcitors 104 and 106 to circuit ground or some other suitable electrical reference at terminal 108.

In operation, the matching network is receptive of RF signal at one particular frequency to use all of the inductive and capacitive components therein to match to antenna 90. Subsequently, at a time when the frequency of the RF signal applied between terminals 94 and 95 is switched to a different value it is desired to change the values of inductance and capacitance.

Therefore, current is applied to the laser diodes of all of laser diode switches 10 illustrated in FIG. 5, causing the PIN diodes thereof to be rendered conductive and therefore bypassing inductors 98 and 100 and capacitor 104. As described in connection with the operation of FIG. 1, the laser diodes do not need to be continuously illuminated to provide the conductive (on) condition but rather they can be pulsed on an off at approximately a 2% percent duty cycle which will still cause the actual PIN diode to remain in the conductive state.

What is claimed is:

1. A photon energy activated radio frequency (RF) signal switch comprising in combination:
    a photon energy activated PIN diode coupled between a signal input terminal and a signal output terminal;
    means for reverse biasing said PIN diode by a continuously supplying a direct current voltage thereto;
    a source of RF signal coupled to said input terminal, and;
    means not including said source of RF signal for selectively providing photon energy to said PIN diode to render it continuously conductive to pass said RF signal from said input terminal to said output terminal.

2. The combination as set forth in claim 1 wherein said means for selectively providing photon energy is a laser light source.

3. The combination as set forth in claim 2 wherein said means for reverse biasing said PIN diode includes a bias resistor series connected with said PIN diode.

4. The combination as set forth in claim 3 wherein said resistor has a value at least about 100 ohms.

5. The combination as set forth in claim 1 wherein said means for selectively providing photon energy includes means for alternately pulsing said photon energy on and off at a sufficiently high frequency to cause said PIN diode to be rendered continuously conductive to pass said RF signal.

6. The combination as set forth in claim 5 wherein said means for selectively providing photon energy is a laser light source.

7. The combination as set forth in claim 6 wherein said means for reverse biasing said PIN diode includes a bias resistor series connected with said PIN diode.

8. The combination as set forth in claim 7 wherein said resistor has a value at least about 100 ohms.

9. The combination as set forth in claim 5 wherein said means for pulsing said photon energy on and off includes means for pulsing said photon energy on for less than half the combined on and off times.

10. The combination as set forth in claim 5 wherein said means for pulsing said photon energy on and off includes means for pulsing said photon energy on for less than 10% of the combined on and off times.

* * * * *

UNITED STATES PATENT AND TRADEMARK OFFICE
CERTIFICATE OF CORRECTION

PATENT NO. : 5,001,355

DATED : March 19, 1991

INVENTOR(S) : Arye Rosen et al.

It is certified that error appears in the above-identified patent and that said Letters Patent is hereby corrected as shown below:

Column 1, line 13, "connected" should be --connect--.

Column 1, line 21, "continouosly" should be --continuously--.

Column 1, line 64, "voltage" should be --voltages--.

Column 2, line 34, "pulses" should be --pulse--.

Column 2, line 51, "convalent" should be --covalent--.

Column 2, line 55, "fahion" should be --fashion--.

Column 3, line 43, "obsorption" should be --absorption--.

Column 3, line 49, "illustrated" should be --illustrates--.

Column 4, line 5, "Metallizatin" should be --Metallization--.

Column 4, line 5, "863" should be --86--.

Column 4, line 25, "resepctively" should be --respectively--.

UNITED STATES PATENT AND TRADEMARK OFFICE
CERTIFICATE OF CORRECTION

PATENT NO. : 5,001,355

DATED : March 19, 1991

INVENTOR(S) : Arye Rosen et al.

It is certified that error appears in the above-identified patent and that said Letters Patent is hereby corrected as shown below:

Column 4, line 25, "Additinal" should be --Additional--.

Column 4, line 29, "in" should be --is--.

Column 4, line 43, "efficiecy" should be --efficiency--.

Column 4, lines 59 and 60, "capcitors" should be --capacitors--.

Signed and Sealed this

Twenty-second Day of September, 1992

Attest:

DOUGLAS B. COMER

*Attesting Officer*  *Acting Commissioner of Patents and Trademarks*